United States Patent [19]

Nagata et al.

[11] Patent Number: 5,146,047
[45] Date of Patent: Sep. 8, 1992

[54] ELECTRIC-WAVE ABSORBING MATERIAL FOR CONSTRUCTION

[75] Inventors: Kouji Nagata; Minoru Sugita, both of Tokyo; Keisuke Kida, Aichi; Toru Watanabe; Ken'yo Matsushita, both of Shizuoka, all of Japan

[73] Assignees: Shimizu Construction Co., Ltd.; Nippon Light Metal Company, Ltd., both of Tokyo, Japan

[21] Appl. No.: 665,964

[22] Filed: Mar. 7, 1991

[30] Foreign Application Priority Data

Mar. 16, 1990 [JP] Japan .................................. 2-66612
Mar. 16, 1990 [JP] Japan .................................. 2-66613

[51] Int. Cl.$^5$ .............................................. H05K 9/00
[52] U.S. Cl. .......................... 174/35 MS; 174/35 R
[58] Field of Search .......... 174/35 R, 35 MS, 35 GC; 361/424; 219/10.55 D, 10.55 R

[56] References Cited

U.S. PATENT DOCUMENTS 4,948,922  8/1990  Varadan et al. ............... 174/35 GC

FOREIGN PATENT DOCUMENTS 58-71699  4/1983  Japan .

*Primary Examiner*—Leo P. Picard
*Assistant Examiner*—Bot Lee Ledynh
*Attorney, Agent, or Firm*—Finnegan, Henderson, Farabow, Garrett and Dunner

[57] ABSTRACT

The electric-wave absorbing material for construction includes a medium and a large number of electric-wave absorbing particles dispersed therein. The particles are in the form of capsules filled with water. The electric-wave absorbing material for construction may be made of a construction material having provided thereon an electric-wave absorbing layer which includes such electric-wave absorbing particles.

22 Claims, 1 Drawing Sheet

ELECTRIC-WAVE ABSORBING MATERIAL FOR CONSTRUCTION

BACKGROUND OF THE INVENTION

The present invention relates to an electric-wave absorbing material for construction, which can be used as an exterior material, an interior material, a flooring material, or the like.

Prior Art

Electric-wave absorbers having various compositions and forms have heretofore been devised, and some of them have already been put into practical use.

In order to obtain good electric-wave absorbers, two requirements must be satisfied at the same time. That is, on one hand, electromagnetic waves should not reflect from the surfaces of the electric-wave absorbers and should enter into the body of the electric-wave absorbers; and on the other hand, the electromagnetic waves which have entered into the body of the electric wave absorbers should attenuated quickly. The first requirement can be met by setting up normalized input impedance observed on the surface of the electric-wave absorber to one, and the second requirement can be met by increasing one or both of electric loss and magnetic loss of the electric-wave absorber.

Naturally occurring materials are rarely used as materials for making electric-wave absorbers.

This is because it is only when complex dielectric constant $\epsilon$ and complex permeability $\mu$, which represent electric properties of the material used as an electric-wave absorber, bear some particular relationships to the thickness of the electric-wave absorber and the frequency of the electric wave used, that the above-described normalized input impedance becomes equal to one, and because it is difficult to have the naturally occurring materials adjusted so that they can meet conditions under which the normalized input impedance is one no matter how high their electric loss or magnetic loss is. Therefore, in designing ordinary electric-wave absorbers, it has been adopted a method in which a plurality of materials are mixed and the complex dielectric constant $\epsilon$ and complex permeability $\mu$ of the electric-wave absorber is adjusted by varying the mixing ratio of the component materials. Accordingly, a step of mixing a plurality of materials is indispensable in the manufacture of electric-wave absorbers, the step of which involves strict control of the mixing ratio of component materials, and is thus inconvenient.

Furthermore, in the case where such electric-wave absorbers, as described above, are used as a construction material, they are mostly used in the form of panels. In this situation, it is important that the panels to be used as a construction material be as thin as possible.

SUMMARY OF THE INVENTION

Therefore, it is an object of the present invention to provide an electric-wave absorbing material for construction which utilizes water that exists in an inexhaustible supply in the natural environment, which takes advantage of the excellent electric absorbing property of water itself, and which can readily be endowed with an electric wave absorbing property in a simple manner and can be made in the form of a thin panel.

Under the circumstances, extensive investigations have been made and as a result it has now been found that the above object can be achieved by the use of electric-wave absorbing particles composed of capsules filled with water in a medium.

Therefore, according to one aspect of the present invention, there is provided an electric-wave absorbing material for construction, comprising a medium and a plurality of electric-wave absorbing particles dispersed in said medium, said electric-wave absorbing particles being capsules filled with water.

In another aspect of the present invention, there is provided an electric-wave absorbing material for construction including a construction material having provided therein an electric-wave absorbing layer, wherein said electric-wave absorbing layer comprises a medium and a plurality of electric wave absorbing particles dispersed in said medium, said electric wave absorbing particles being capsules filled with water.

According to the present invention, water, which is known to have excellent electric-wave absorbing property but has been difficult to handle because of its fluidity, can be retained stably in capsules and construction materials made of a medium such as cured cement and can be endowed with excellent electric-wave absorbing property by dispersing the capsules in the medium.

BRIEF DESCRIPTION OF ACCOMPANYING DRAWINGS

DESCRIPTION OF PREFERRED EMBODIMENTS

Now, referring to the accompanying drawings, the present invention will be described in greater detail.

Figure 1:
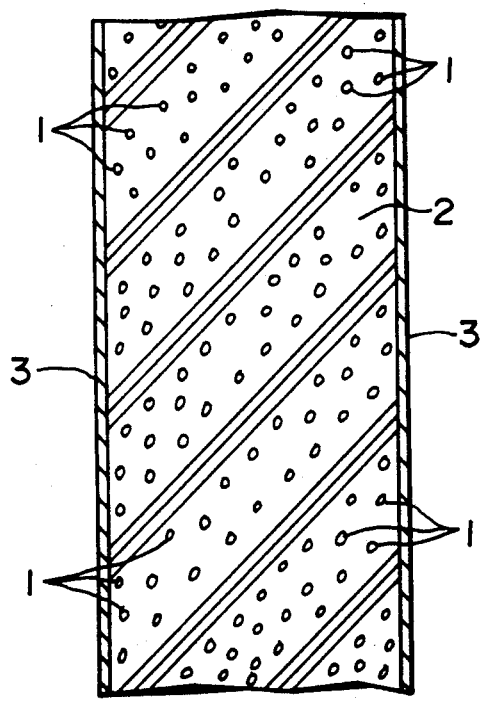
FIG. 1 is a diagrammatic cross section of the electric-wave absorbing material for construction according to the first embodiment of the present invention.

As illustrated in FIG. 1, the electric-wave absorbing material according to the first embodiment of the present invention is a construction material including electric-wave absorbing particles 1 which are capsules filled with water and dispersed in a cement-type cured body 2 at a capsule/cement volume ratio of 15 to 45%, to form a construction material in the form of a plate, on each side of which is covered with a water impermeable sheet 3.

The capsules, which constitute the surfaces of the electric wave absorbing particles 1, are preferably made of an organic polymer such as nylon, polyurethane, urea resin, polystyrene, or the like. That is, the capsules are constituted of a dielectric material represented by, for example, the above-mentioned resins, and their inner cavities are filled with water. It is optional to select the size of the capsule, however, the size of the capsule is preferably no larger than about 30 mm. For example, it is possible to use so-called microcapsules having a diameter less than 1 mm. Also, there may be used spherical capsules having a relatively small diameter such as high density polyethylene spheres having a diameter of 30 mm and a wall or film thickness of about 1.2 mm, for example.

The water to be filled in the capsules is usually an unprocessed water such as tap water. Highly conductive water such as water containing inorganic or organic ions (cations and/or anions) may also be filled in the capsules. In this case, higher conductivity losses can be gained and therefore better results can be obtained.

As the cement-type cured body 2, there can be used ordinary concretes, mortars and the like. In addition, light-weight concretes, light-weight mortars, resin concretes, and the like, can also be used. It is also possible to add carbon powder to the cement-type cured body 2 to increase its electric-wave absorbing properties.

The aforementioned water-impermeable sheet 3 is made of a resin having a high gas barrier property, for example, polyethylene terephthalate. The sheet 3 prevents leakage or discharge of water to outside of the capsules, which prevents decrease of the electric-wave absorbing property of the cement-type cured body 2 itself.

In this embodiment, the excellent electric-wave absorbing property of water can be fully exhibited, thus increasing the electric-wave absorbing property of the construction material, because the capsules constituting the surfaces of the electric-wave absorbing particles 1 are made of a dielectric material Now, referring to FIG. 2, the electric wave absorbing material according to the second embodiment of the present invention will be described.

Figure 2:
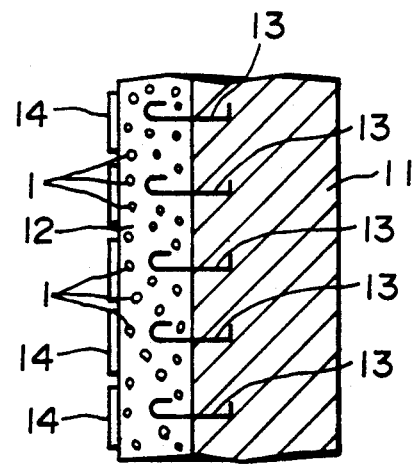
FIG. 2 is a diagrammatic cross section of the electric-wave absorbing material for construction according to the second embodiment of the present invention.

As illustrated in FIG. 2, a construction material 11, made of a concrete, or the like, is provided with an electric-wave absorbing layer 12. The layer 12 is attached to the construction material 11 through a plurality of anchors 13 partially embedded in the material 11 In order to give decorative effects and improve weatherability, a plurality of tiles 14 made of a non-metallic material (such as brick, porcelain, or the like) conventionally used for construction, are provided on the surface of the layer 12.

The electric-wave absorbing layers 12 are made of a medium composed of a resin such as polycarbonate, epoxy resin, or the like, or fiber-reinforced resin, and a large number of capsules 1 are dispersed therein. The capsules 1 used in this embodiment may be exactly the same in material or composition, size and form, as those used in the preceding embodiment.

Figure 3:
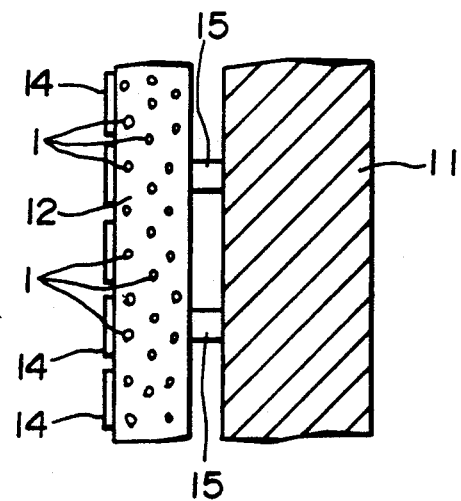
FIG. 3 is a diagrammatic cross section of the electric-wave absorbing material for construction according to a variation of the second embodiment of the present invention.

FIG. 3 illustrates a variation of the electric-wave absorbing material according to the second embodiment of the present invention. The electric wave absorbing material of this variation is the same as that of the second embodiment except that the electric wave absorbing layer 12 is attached to the construction material 11 through a plurality of supporting means 15 such as rods or pipes made of, for example, a metal such as steel, conventionally used for construction, such that the electric-wave absorbing layer 12 is supported on to the construction material at an appropriate distance. This construction is useful in the case where the difference in the coefficient of thermal expansion between the layer 12 and the construction material is not negligible. The clearance between the layer 12 and the construction material 11 is also useful when direct contact between the two materials is undesirable for one reason or another.

According to the present invention, it is easy to make smaller the thickness of the electric-wave absorbing material when it is used in the form of a panel.

What is claimed is:

1. An electric-wave absorbing material for construction, comprising a medium and a plurality of electric wave absorbing particles dispersed in said medium, said electric-wave absorbing particles being capsules filled with water.

2. The material as claimed in claim 1, wherein said medium is a cement-type cured body.

3. The material as claimed in claim 1, wherein said electric wave absorbing particles are contained in said medium in a volume ratio of 15 to 45%.

4. The material as claimed in claim 1, further comprising a water-impermeable sheet provided on both sides of said electric absorbing material.

5. The material as claimed in claim 1, wherein said water is a highly conductive water containing inorganic ions.

6. The material as claimed in claim 1, wherein said capsules are microcapsules having a diameter no larger than 1 mm.

7. The material as claimed in claim 1, wherein said capsules are spherical capsules having a diameter of no smaller than 1 mm and no larger than 30 mm.

8. The material as claimed in claim 2, wherein said cement-type cured body contains carbon powder.

9. The material as claimed in claim 1, wherein walls of said capsules are made of a resin selected from the group consisting of nylon, polyurethane, urea resin and polystyrene.

10. An electric-wave absorbing material for construction including a construction material having provided thereon an electric wave absorbing layer, wherein said electric wave absorbing layer comprises a medium and a plurality of electric wave absorbing particles dispersed in said medium, said electric wave absorbing particles being capsules filled with water.

11. The material as claimed in claim 10, wherein said electric-wave absorbing layer is attached to said construction material by an anchoring members.

12. The material as claimed in claim 10, wherein said electric-wave absorbing layer is attached to said construction material through supporting means so that the electric-wave absorbing layer is disposed at a predetermined distance from the construction material.

13. The material as claimed in claim 10, wherein said medium is made of a resin.

14. The material as claimed in claim 10, wherein said electric-wave absorbing particles are contained in said medium in a volume ratio of 15 to 45%.

15. The material as claimed in claim 10, wherein said water is a highly conductive water containing inorganic ions.

16. The material as claimed in claim 10, wherein said capsules are microcapsules having a diameter no larger than 1 mm.

17. The material as claimed in claim 10, wherein said capsules are spherical capsules having a diameter no less than 1 mm and no greater than 30 mm.

18. The material as claimed in claim 10, wherein walls of said capsules are made of a resin selected from the group consisting of nylon, polyurethane, urea resin, and polystyrene.

19. The material as claimed in claim 10, further comprising a plurality of tiles provided on said electric-wave absorbing layer.

20. The material as claimed in claim 1, wherein said water is a highly conductive water containing organic ions.

21. The material as claimed in claim 10, wherein said medium is made of a fiber-reinforced resin.

22. The material as claimed in claim 10, wherein said water is a highly conductive water containing organic ions.

* * * * *

UNITED STATES PATENT AND TRADEMARK OFFICE
CERTIFICATE OF CORRECTION

PATENT NO. : 5,146,047
DATED : September 08, 1992
INVENTOR(S) : Kouji Nagata et al.

It is certified that error appears in the above-identified patent and that said Letters Patent is hereby corrected as shown below:

Claim 4, column 4, line 10, change "electric" to --electric-wave--.

Claim 11, column 4, line 34, change "members" to --member--.

Signed and Sealed this

Second Day of November, 1993

Attest:

BRUCE LEHMAN

Attesting Officer

Commissioner of Patents and Trademarks